US006841872B1

(12) United States Patent
Ha et al.

(10) Patent No.: US 6,841,872 B1
(45) Date of Patent: Jan. 11, 2005

(54) SEMICONDUCTOR PACKAGE AND FABRICATION METHOD THEREOF

(75) Inventors: Seong-Kweon Ha, Kyoungki-Do (KR); Jong-Hun Kim, Choongcheongbuk-Do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 59 days.

(21) Appl. No.: 09/709,523

(22) Filed: Nov. 13, 2000

(30) Foreign Application Priority Data

Jan. 5, 2000 (KR) ............................................ 2000/285

(51) Int. Cl.[7] ...................... H01L 23/48; H01L 23/52; H01L 29/40
(52) U.S. Cl. ...................... 257/736; 257/698; 257/738
(58) Field of Search ............................... 257/678, 692, 257/693, 697, 698, 773, 779, 780, 781, 782, 783, 784, 737, 738, 613, 620, 529, 668, 623, 696; 438/106

(56) References Cited

U.S. PATENT DOCUMENTS 6,181,569 B1 * 1/2001 Chakravorty ............... 361/761
6,235,552 B1 * 5/2001 Kwon ......................... 438/106
6,268,642 B1 * 7/2001 Hsuan et al. ................ 257/620
6,278,171 B2 * 8/2001 Arndt et al. ................. 257/529
6,291,259 B1 * 9/2001 Chun ........................... 438/106
6,291,897 B1 * 9/2001 Wark et al. .................. 257/786

* cited by examiner

Primary Examiner—Long Pham
Assistant Examiner—Dana Farahani
(74) Attorney, Agent, or Firm—Piper Rudnick LLP

(57) ABSTRACT

A semiconductor package and a fabrication method thereof can enhance adhesion between a solder and a package body by employing an irregular metal pattern, and improve stability. The semiconductor package includes a semiconductor substrate; a plurality of chip pads separately formed on an upper surface of the semiconductor substrate; an irregular metal pattern electrically connected to the plurality of chip pads; and an external terminal electrically connected to the metal pattern. In addition, a method of fabricating the semiconductor package includes the steps of separately forming a plurality of chip pads on an upper surface of a semiconductor substrate; forming an irregular metal pattern electrically connected to the plurality of chip pads; and forming an external terminal electrically connected to the metal of chip pads; and forming an external terminal electrically connected to the metal pattern.

9 Claims, 4 Drawing Sheets

SEMICONDUCTOR PACKAGE AND FABRICATION METHOD THEREOF

This application claims the benefit of Application No. 285/2000, filed in Korea on Jan. 5, 2000, which is hereby incorporated by reference.

BACKGROUND OF THE INVENTION

1. Field of the Invention

The present invention relates to a semiconductor package and a fabrication method thereof, and in particular to an improved semiconductor package which enhances adhesion between a solder and a package body and improves stability and a fabrication method thereof.

2. Discussion of the Related Art

There is an increasing demand for miniaturization of non-memory products, such as microprocessors and custom semiconductors ASIC. As a result, in order to utilize a plurality of pins, a ball grid array (BGA) arranging a ball-shaped external terminal below a package has become a main semiconductor package.

The BGA takes concepts of a pin grid array (PGA) and a flip chip. Accordingly, a space of a conventional semiconductor package is reduced by approximately 60%, and electrical and thermal execution power is increased by 40%. In case the BGA uses more than 300 pins, it is advantageous in cost as well.

Various chip size package (CSP) techniques have been recently developed to the extent that the semiconductor chip and package are only slightly different in size. The CSP techniques have been rapidly widespread according to the miniaturization, high speed and high integration tendency of the semiconductor, more than the applicants expected.

In addition, a wafer level package technique performing all assembly steps in a wafer state where chips are not cut is acknowledged as the CSP technique for the next generation. A semiconductor assembly process is generally performed after cutting a wafer into respective chips. Conversely, in the wafer level package technique, a series of assembly steps, such as die bonding, wire bonding and molding are carried out in the wafer state where the chips are connected, and thereafter the chips are cut. Accordingly, the wafer level package technique can reduce an entire packaging cost more than the currently-used CSP techniques.

FIG. 1 illustrates a conventional wafer level chip size package (WLCSP). As depicted in FIG. 1, a plurality of chip pads 3 are separately formed on an upper surface of a wafer 1. A passivation layer 5 is formed on the upper surface of the wafer 1 so that a region of an upper surface of the plurality of chip pads 3 are exposed. An under bump metallurgy (UBM) 7 is formed at upper surfaces of the plurality of chip pads 3 exposed through the passivation layer 5. The UBM 7 is formed in order to enhance adhesion between the plurality of chip pads 3 and a solder ball 9 (to be discussed later) and generally consists of a 2- to 3-level metal layer. After forming the UBM 7, a solder paste is coated on upper surfaces of the UBM 7 and the passivation layer 5. The solder ball 9 is formed after a reflow step, thereby fabricating the WLCSP.

One disadvantage of the conventional WLCSP is that adhesion between the solder ball 9 and the UBM 7 is weak. Accordingly, separation may take place due to the weak adhesion between the solder ball 9 and the UBM 7, after constant switching operations of a chip. Therefore, the solder ball 9 may be easily separated from a package body.

Another disadvantage of the conventional WLCSP is that materials constituting the UBM 7 are difficult to combine.

SUMMARY OF THE INVENTION

Accordingly, the present invention is directed to a semiconductor package and a method of fabricating the same that substantially obviates one or more of the problems due to the limitations and disadvantages of the related art.

An object of the present invention to prevent a solder ball from being separated from a semiconductor package.

It is another object of the present invention to improve performance and reliability of a package, when constituting a metal layer in a wafer level chip size package.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the semiconductor package includes a semiconductor substrate; a plurality of chip pads separately formed on an upper surface of the semiconductor substrate; an irregular metal pattern being electrically connected to the plurality of chip pads; and an external terminal electrically connected to the metal pattern.

In another aspect of the present invention, the semiconductor package includes a semiconductor substrate; a plurality of chip pads being separately formed on an upper surface of the semiconductor substrate; a first metal pattern formed on upper surfaces of the plurality of chip pads; a second metal pattern having an irregular shape, and formed on an upper surface of the first metal pattern; and an external terminal electrically connected to the second metal pattern.

In a further aspect of the present invention, there is provided a method of fabricating the semiconductor package including the steps of separately forming a plurality of chip pads on an upper surface of a semiconductor substrate; forming an irregular metal pattern electrically connected to the plurality of chip pads; and forming an external terminal electrically connected to the metal pattern.

In yet a further aspect of the present invention, there is provided a method of fabricating the semiconductor package including the steps of separately forming a plurality of chip pads on an upper surface of a semiconductor substrate; forming a first metal pattern on upper surfaces of the plurality of chip pads; forming a second metal pattern having an irregular shape on an upper surface of the first metal pattern; and forming an external terminal electrically connected to the second metal pattern.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of the specification, illustrate embodiments of the invention and together with the description serve to explain the principles of the invention. In the drawings.

DETAILED DESCRIPTION OF THE PREFERRED EMBODIMENTS

A structure of a semiconductor device and a fabrication method thereof in accordance with a preferred embodiment of the present invention will now be described in detail with reference to the accompanying drawings. Here, a WLCSP is exemplified. However, the present invention may be applied to different kinds of packages.

Figure 1:
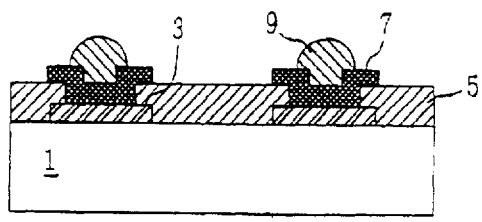
FIG. 1 is a cross-sectional view illustrating a conventional wafer level chip size package.
Figure 2:
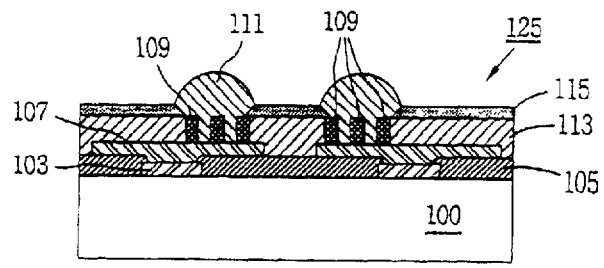
FIG. 2 is a cross-sectional view illustrating a wafer level chip size package in accordance with a preferred embodiment of the present invention.

FIG. 2 illustrates a WLCSP 125 in accordance with the preferred embodiment of the present invention. As depicted therein, a plurality of chip pads 103 are separately formed on an upper surface of a semiconductor substrate 100 in a wafer state. A first insulation layer 105, which includes polymide or benzocyclobutene (BCB), is formed on a region of the upper surface of the semiconductor substrate 100 that is not occupied by the plurality of chip pads 103. A first metal pattern 107 is electrically connected to the plurality of chip pads 103 and separately formed on upper surfaces of the plurality of chip pads 103 and the first insulation layer 105. The first metal pattern 107 may include Ti, Al or Cr. The preferred embodiment employs Ti which has superior adhesion with a polymer, a nitride and an oxide on the semiconductor substrate 100, and has a small contact resistance. A second metal pattern 109 of an irregular shape is formed on a region of the first metal pattern 107. Various metals may be used as a material of the second metal pattern 107. The preferred embodiment employs Ni which has superior adhesion with a solder, and also has small reactivity with the solder. A second insulation layer 113, which mostly includes photoresist or BCB, is formed thick on upper surfaces of the first insulation layer 105 and the first metal pattern 107 in order to seal up the first insulation layer 105, the first metal pattern 107 and the second metal pattern 109. At this point, an upper surface and side portions of the second metal pattern 109 are not sealed up. In the preferred embodiment, the second insulation layer 113 may include the photoresist or BCB. A solder mask 115 is formed on an upper surface of the second insulation layer 113 so that the second metal pattern 109 is exposed. The solder mask 115 protects metal wiring and determines a position of a solder ball 111. In case the second insulation layer 113 consists of the BCB, the solder mask 115 may not be provided. The solder ball 11 is electrically connected to the upper surface and the side portions of the second metal pattern 109 and is formed as an external terminal on a surface of the second metal pattern 109 exposed through the solder mask 115.

FIGS. 3A to 3J are cross-sectional views illustrating a preferred embodiment of a method of fabricating a semiconductor package in accordance with the present invention.

Figure 3A:
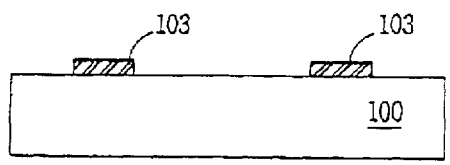
FIGS. 3A to 3J are cross-sectional views illustrating a method of fabricating the wafer level chip size package in accordance with a preferred embodiment of the present invention.

As illustrated in FIG. 3A, a semiconductor substrate 100 in a wafer state is prepared. Here, a plurality of chip pads 103 are separately formed on an upper surface of the semiconductor substrate 100.

Figure 3B:

As shown in FIG. 3B, upper surfaces of the semiconductor substrate 100 and the plurality of chip pads 103 are coated with a polymide or BCB, and patterned. Accordingly, a first insulation layer 105 is formed so that the upper surfaces of the plurality of chip pads 103 are exposed.

Figure 3C:
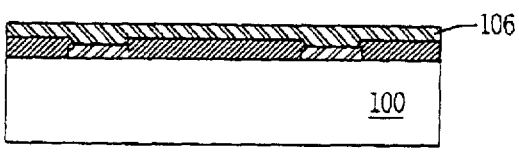

As depicted in FIG. 3C, a metal layer 106, including Ti, is deposited according to a deposition method, such as a sputtering process, on upper surfaces of the first insulation layer 105 and the plurality of exposed chip pads 103.

Figure 3D:
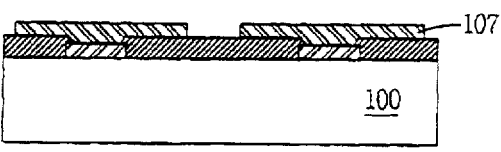

As illustrated in FIG. 3D, a pad redistribution step is performed in order to form a first metal pattern 107, which is electrically connected to the plurality of chip pads 103, by patterning the metal layer 106.

Since a distribution pitch of the plurality of chip pads 103 is only 100 to 150 mm, it is difficult to directly form a solder ball 111 on the plurality of chip pads 103. In addition, when a package is fabricated and mounted on a printed circuit board (PCB), intervals and distribution of the solder ball 111 needs to be adjusted, which is the reason a pad redistribution step is carried out.

Figure 3E:
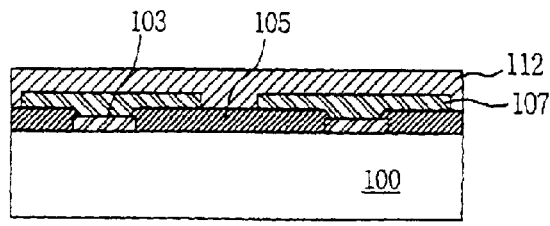

As shown in FIG. 3E, a photoresist layer 112 is spread thick on upper surfaces of the first metal pattern 107 and the first insulation layer 105.

Figure 3F:
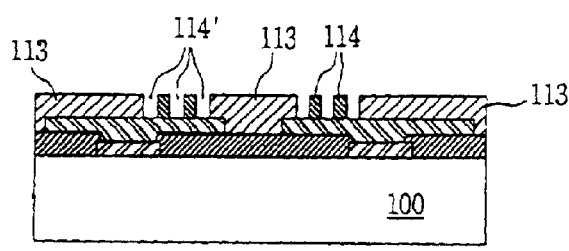

Thereafter, as illustrated in FIG. 3F, a second insulation layer 113 is formed by patterning the photoresist layer 112 in order to form an irregular photoresist layer pattern 114 on a portion of the first metal pattern 107.

Figure 3G:
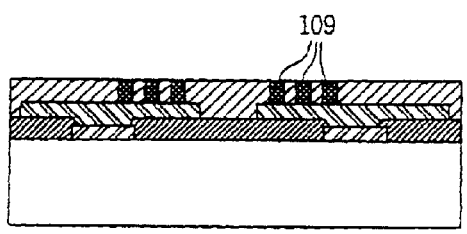

As depicted in FIG. 3G, a second metal pattern 109, having an irregular shape, is formed by filling nickel in a space of the irregular photoresist layer pattern 114. A step for filling nickel may be performed according to a deposition method, such as the sputtering process. However, in the present embodiment, an electro-plating process is utilized due to restriction of thickness.

Figure 3H:
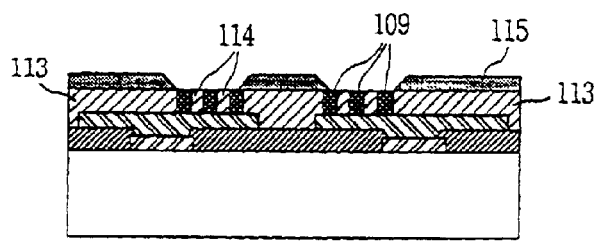

As illustrated in FIG. 3H, a solder mask 115 is formed on an upper surface of the second insulation layer 113 so that the second metal pattern 109 and the irregular photoresist layer pattern 114 are exposed. The solder mask 115 prevents solder from being covered at unnecessary portions during a succeeding solder paste covering step and a reflow step.

Figure 3I:
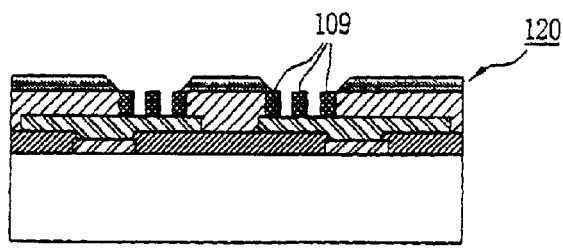
Figure 3J:
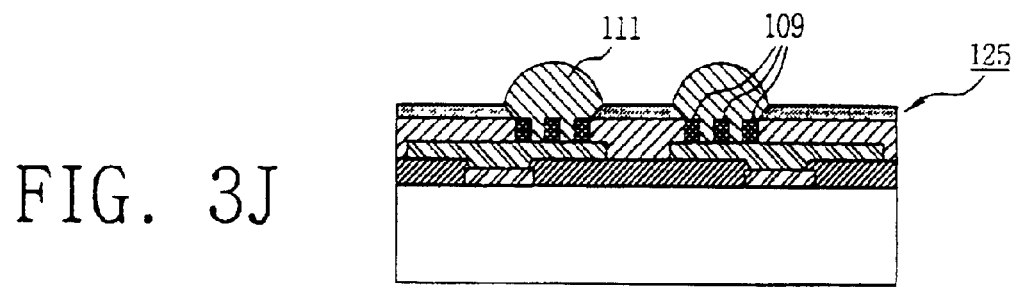

As depicted in FIG. 3I, the irregular photoresist layer pattern 114 exposed through the solder mask 115 is removed.

Thereafter, a solder paste is covered on an upper surface of a package body 120 illustrated in FIG. 3I, and the reflow step is carried out thereon. The solder ball 111 is electrically connected to upper and side portions of the exposed second metal pattern 109 and is formed as an external terminal, thereby finishing fabrication of the WLCSP 125.

FIGS. 4A to 4K are cross-sectional views illustrating another preferred embodiment of a method of fabricating a semiconductor package in accordance with the present invention.

Figure 4A:
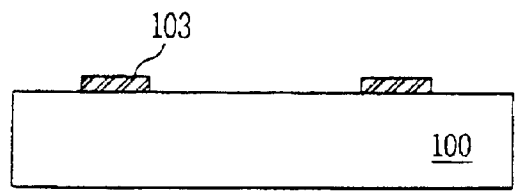
FIGS. 4A to 4K are cross-sectional views illustrating a method of fabricating the wafer level chip size package in accordance with another preferred embodiment of the present invention.

As illustrated in FIG. 4A, a semiconductor substrate 100 in a wafer state is prepared. Here, a plurality of chip pads 103 are separately formed on an upper surface of a semiconductor substrate 100.

Figure 4B:
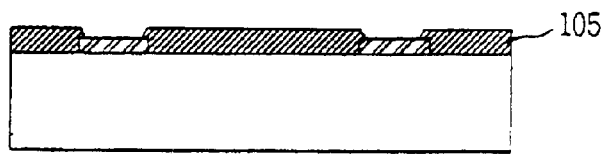

As shown in FIG. 4B, upper surfaces of the semiconductor substrate 100 and the plurality of chip pads 103 are coated with a polymide or BCB, and patterned. Accordingly, a first insulation layer 105 is formed so that upper surfaces of the plurality of chip pads 103 are exposed.

Figure 4C:
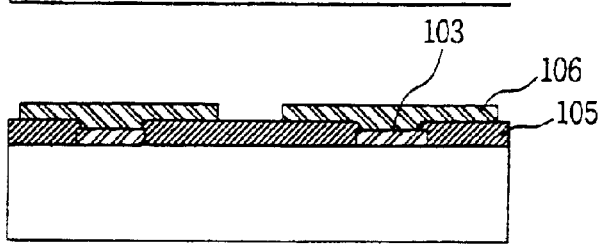

As depicted in FIG. 4C, a metal layer 106, including Ti, is deposited according to a deposition method, such as the sputtering process, on upper surfaces of the first insulation layer 105 and the exposed plurality of chip pads 103.

Figure 4D:
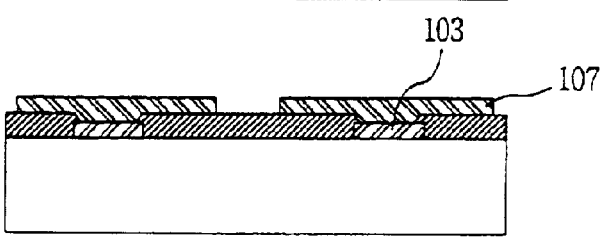

As illustrated in FIG. 4D, a pad redistribution step is performed in order to form a first metal pattern 107, which is electrically connected to the plurality of chip pads 103, by patterning the metal layer 106.

Figure 4E:
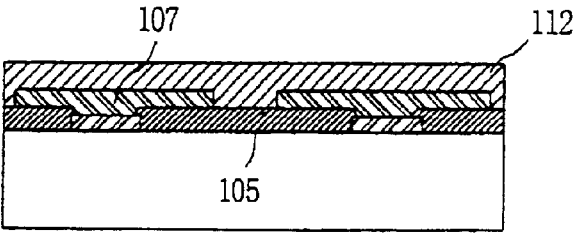

As shown in FIG. 4E, a photoresist layer 112 is spread thick on upper surfaces of the first metal pattern 107 and the first insulation layer 105.

Figure 4F:
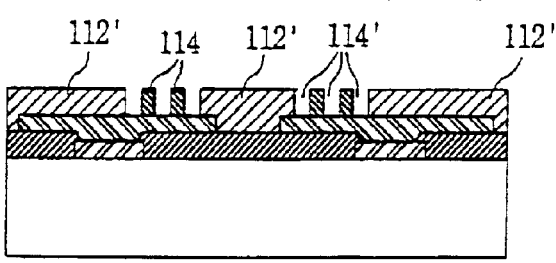

As illustrated in FIG. 4F, the photoresist layer 112 is patterned so that an irregular photoresist layer pattern 114 is formed on a region of the first metal pattern 107.

Figure 4G:
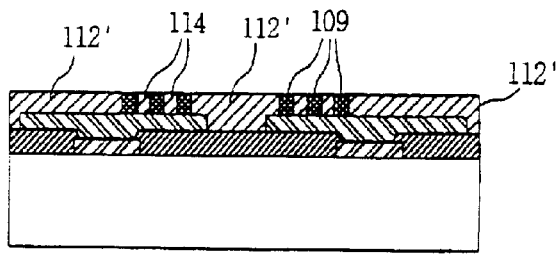

Thereafter, as depicted in FIG. 4G, a second metal pattern 109, having an irregular shape, is formed by filling nickel in a space 114' of the irregular photoresist layer pattern 114 according to an electro-plating process.

Figure 4H:
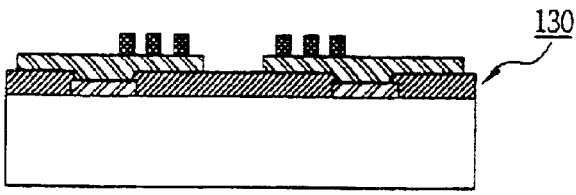

As illustrated in FIG. 4H, the photoresist layers, including the irregular photoresist layer pattern 114 illustrated in FIG. 4G, are removed.

Figure 4I:
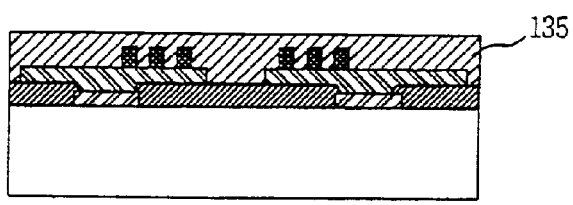

As shown in FIG. 4I, a BCB layer 135 is spread thick on an upper surface of the package body 130 shown in FIG. 4H, thereby sealing up the second metal pattern 109 having an irregular shape.

Figure 4J:
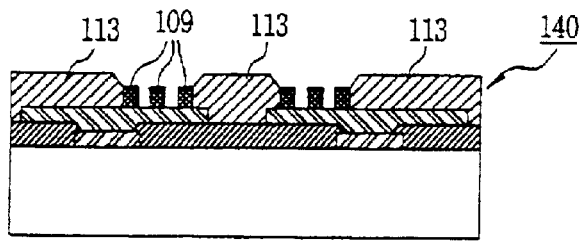

As depicted in FIG. 4J, a second insulation layer 113 is formed by patterning the BCB layer 135 so that an upper surface and side portions of the second metal pattern 109 are exposed.

Figure 4K:
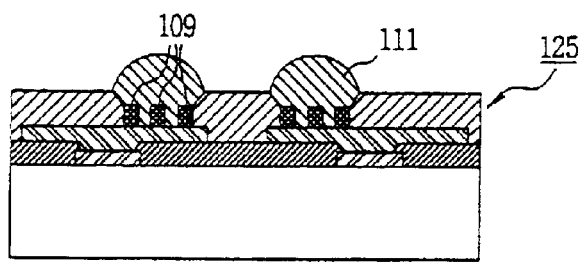

As illustrated in FIG. 4K, a solder paste is spread on an upper surface of a package body 140 as shown in FIG. 4J, and a reflow process is performed thereon. Accordingly, a solder ball 111, electrically connected to the upper and side portions of the exposed second metal pattern 109, is formed as an external terminal, thereby completing a WLCSP 125 in accordance with another preferred embodiment of the present invention.

As discussed earlier, in a semiconductor package in accordance with the present invention, an adhesion portion of a package body to the solder ball 111 includes a metal having an irregular shape, and thus an adhesion side thereof is increased, thereby improving adhesion strength between the solder ball 111 and the package body. As a result, the solder ball 111 is prevented from separating from the package body, thereby improving reliability of the semiconductor package.

In addition, in the semiconductor package in accordance with the present invention, respective metal layers are formed by different steps. Accordingly, it is easy to respectively select materials of the metal layers.

Moreover, the semiconductor package of the present invention can be fabricated according to a conventional package method by using identical devices as the conventional ones. Therefore, it is easy to apply the present invention.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the meets and bounds of the claims, or equivalents of such meets and bounds are therefore intended to be embraced by the appended claims.

What is claimed is:

1. A semiconductor package, comprising:

a semiconductor substrate;

a plurality of chip pads separately formed on an upper surface of the semiconductor substrate;

a first metal pattern formed on an upper surface of respective chip pads;

a second metal pattern formed on an upper surface of the first metal pattern and having a plurality of bulkheads separately formed on the first metal pattern, wherein a width of the bulkhead is uniform regardless of a height of the bulkhead; and an external terminal electrically connected to an upper surface of the second metal pattern and a side portion of the bulkhead and extending into a space between the plurality of bulkheads.

2. The semiconductor package according to claim 1, wherein the first metal pattern includes titanium.

3. The semiconductor package according to claim 1, wherein the second metal pattern includes nickel.

4. The semiconductor package according to claim 1, further comprising:

a first insulation layer formed on a region of the upper surface of the semiconductor substrate not occupied by the plurality of chip pads; and a second insulation layer formed on upper surfaces of the first insulation layer and the first metal pattern.

5. The semiconductor package according to claim 4, wherein the first insulation layer includes polymide or benzocyclobutene.

6. The semiconductor package according to claim 4, wherein the second insulation layer includes a photoresist layer or benzocyclobutene.

7. The semiconductor package according to claim 4, further comprising a solder mask formed on an upper surface of the second insulation layer.

8. The semiconductor package according to claim 4, wherein the external terminal includes a solder ball.

9. The semiconductor package according to claim 8, wherein the semiconductor substrate includes a wafer.

* * * * *